United States Patent [19]
Yumioka et al.

[11] Patent Number: 5,386,550
[45] Date of Patent: Jan. 31, 1995

[54] PSEUDO-LSI DEVICE AND DEBUGGING SYSTEM INCORPORATING SAME

[75] Inventors: Tatsuya Yumioka; Toshiharu Kaizawa; Kenichi Hamada; Takeshi Uesaka, all of Hyogo, Japan

[73] Assignee: Fujitsu Limited, Kanagawa, Japan

[21] Appl. No.: 8,555

[22] Filed: Jan. 22, 1993

[30] Foreign Application Priority Data

| Jan. 24, 1992 | [JP] | Japan | 4-011336 |
| Apr. 23, 1992 | [JP] | Japan | 4-104806 |
| Jan. 14, 1993 | [JP] | Japan | 5-004543 |

[51] Int. Cl.$^6$ .............. G06F 11/34; G06F 11/00
[52] U.S. Cl. .............. 395/575; 364/578; 371/16.2
[58] Field of Search ........ 395/575, 500, 800; 364/578, 232.3, 232.8, 244.9, 580, 579; 371/16.2, 23, 22.3, 22.4, 25.1, 27, 22.1, 15.1

[56] References Cited

U.S. PATENT DOCUMENTS

| 4,510,602 | 4/1985 | Engdahl et al. | 371/21.1 |
| 4,594,711 | 6/1986 | Thatte | 371/25.1 |
| 4,635,261 | 1/1987 | Anderson et al. | 371/25.1 |
| 4,697,241 | 9/1987 | Lavi | 364/488 |
| 4,742,293 | 5/1988 | Koo et al. | 371/25.1 |
| 5,068,603 | 11/1991 | Mahoney | 371/22.3 |
| 5,109,353 | 4/1992 | Sample et al. | 364/578 |
| 5,263,149 | 11/1993 | Winlow | 395/500 |
| 5,329,470 | 7/1994 | Sample et al. | 364/578 |

FOREIGN PATENT DOCUMENTS

| 16952 | 2/1979 | Japan . |
| 229964 | 10/1987 | Japan . |
| 49831 | 3/1988 | Japan . |
| 91249 | 4/1989 | Japan . |
| 126724 | 5/1989 | Japan . |
| 154251 | 6/1989 | Japan . |
| 139863 | 6/1991 | Japan . |

Primary Examiner—Charles E. Atkinson
Assistant Examiner—Dieu-Minh Le
Attorney, Agent, or Firm—Nikaido, Marmelstein, Murray & Oram

[57] ABSTRACT

A pseudo-LSI device for emulating a single electronic circuit using a plurality of programmable logic elements mounted on a common circuit board, providing a pseudo-operation unit comprising a plurality of programmable gate arrays constituting a pseudo-LSI when having circuit data written thereto, a nonvolatile memory unit for storing the circuit data to be downloaded from outside, a transfer unit for transferring the circuit data stored in the nonvolatile memory unit to the pseudo-operation unit, and a power supply unit, said four units being provided in the form of an assembly, which can be used in developing LSIs and to debugging systems.

8 Claims, 19 Drawing Sheets

FIG. 10 (a)

Note: * is number of direct line

| | FPGA | | | | | | | | | | | | CONNECTOR | | | | | | | |
|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 1 | 2 | 3 | 4 | 5 | 6 | 7 | 8 |
| 1 | — | 20/40 | 20/40 | 20/40 | 20/40 | 20/40 | 20/40 | 20/40 | 20/40 | 20/40 | 20/40 | 20/40 | | 20 *59*34 | | | | | | |
| 2 | 20/40 | — | 20/40 | 20/40 | 20/40 | 20/40 | 20/40 | 20/40 | 20/40 | 20/40 | 20/40 | 20/40 | | 20 | *5*59*29 | | | | | |
| 3 | 20/40 | 20/40 | — | 20/40/20 *10 | 20/40/20 | 20/40/20 | 20/40/20 *10 | 20/40/20 | 20/40/20 | 20/40/20 | 20/40/20 | 20/40/20 | | 20 | | *29*24 | | | | |
| 4 | 20/40 | 20/40/20 *_ | 20/40/20 *10 | — | 20/40/20 | 20/40/20 | 20/40/20 | 20/40/20 *10 | 20/40/20 | 20/40/20 | 20/40/20 | 20/40/20 | | 20 | | | *35*18 | | | |

PSEUDO-LSI DEVICE AND DEBUGGING SYSTEM INCORPORATING SAME

BACKGROUND OF THE INVENTION

1. Field of the Invention

The present invention relates to pseudo-LSI (Large Scale Integration) devices for use in developing LSI circuits, and to debugging systems having the pseudo-LSI device incorporated therein. The debugging system incorporating the pseudo-LSI device will hereinafter be referred to as an "emulation system".

2. Description of the Related Art

To develop LSI devices in a shortened period of time with an improved efficiency, it has been proposed in recent years to prepare a pseudo-LSI device by an emulation system before the fabrication of an LSI device and to connect the pseudo-LSI device to a target device (actual device) to confirm the operation of the hardware.

When the operation of the hardware is confirmed to some extent, the firmware is checked concurrently for the confirmation of its operation. When the operation of the firmware has been confirmed completely, the operation of the software is confirmed, and the overall system is tested for evaluation. Accordingly, it is desired to use a plurality of pseudo-LSI devices or emulation systems.

The construction of a conventional emulation system will be described with reference to the block diagram of FIG. 16.

The conventional emulation system 1j comprises an operation unit 2j and a pseudo-LSI device 3j.

The operation unit 2j comprises an MPU (microprocessor unit), R/W controller, memory, etc. for downloading circuit data (net list) forwarded form an unillustrated host computer or the like onto the pseudo-LSI device 3j.

The pseudo-LSI device 3j has an FPGA (Field Programmable Gate Array) 12' corresponding in the number of gates to the scale of the pseudo-LSI device. The FPGA 12' has, for example, an SRAM (Static Random Access Memory) incorporated therein. Writing circuit data onto the SRAM provides a pseudo-LSI having a specific hard circuit. Accordingly, the circuit data downloaded from the operation unit 2j is written to the SRAM to provide a corresponding pseudo-LSI device. When the device 3j has a plurality of FPGAs 12', an address decoder or the like is provided as required.

The pseudo-LSI device 3j downloaded with the circuit data is connected to various target devices (target boards) 7, checked for the operation of the hardware of the device 3j itself and operated to test, debug and evaluate the target devices 7.

The FPGA 12' is proposed to evaluate a designed internal circuit of VLSI chip, ASIC device or the like nearly in the form of an actual device, internally has a large quantity of programmable gate structure and is therefore adapted to evaluate the designed circuit nearly as an actual device when programmed with the circuit.

With advances in semiconductor techniques in recent years, however, VLSI chips and ASIC devices having an internal circuits with an increased number of gates are made available in larger quantities, giving rise to the necessity of using a plurality of FPGAs for emulating the function of such large-scale circuits. For the use of a plurality of FPGAs, the assignment of input and output pins of the individual FPGAs needs to be determined, and the connection patterns for connecting the FPGAs must be prepared on a printed circuit board before use.

Nevertheless, different circuits to be evaluated by the pseudo-LSI device require different programs for the FPGA constituting the pseudo-LSI device and different interface signals for communication between the FPGAs. Accordingly, every time a particular internal circuit is to be evaluated, there arises a need to determine input-output pin assignments and to prepare connection patterns on the board. Use of the pseudo-LSI device thus constructed fails to utilize to any extent the universal feature that FPGAs are programmable, necessitating much labor and a great cost for preparing the connection patterns for the evaluation of each of different circuits.

U.S. Pat. No 5,109,353 issued on Apr. 28, 1992 discloses a technique wherein FPGAs are connected to one another by predetermined fixed patterns and are wired according to the internal programs of the respective FPGAs. Although the determination of input-output pin assignments is conventionally followed by the preparation of connection patterns, the proposed technique conversely employs the fixed connection patterns for interconnecting the FPGAs, which are programmed in conformity with the connection patterns.

FIG. 17 is a diagram showing an embodiment of this technique. FPGAs 101, 102, 103, 104 are interconnected by many connection patterns. In the case where the system of this structure is to provide a logic circuit for delivering from a terminal 43 the logical product of signals input to terminals 41, 42, the FPGA 101 is programmed with a pattern 71 through which the signal input from the terminal 41 is delivered as it is to a connection pattern 44, and the FPGAs 102, 103 are similarly programmed respectively with a pattern 72 for connecting the pattern 44 to a connection pattern 45 and with a pattern 73 for connecting the terminal 42 to a connection pattern 46.

The FPGA 104 is programmed with an AND circuit 74 for calculating the logical product of the signals from the connection patterns 45, 46 and is so programmed as to deliver the output of the circuit from the terminal 43. Programming the FPGAs 101, 102, 103, 104 in this way makes it possible to provide a logic circuit for the input signals to the terminals 41, 42 to give a logical product at the terminal 43 even with use of the fixed connection patterns.

VLSI chips or ASIC devices generally provide internal circuits wherein completed specified circuits are integrated in combination into a single chip, and are capable of constituting simplified circuits wherein such component circuits are integrated to ensure connection therebetween or compensate for a delay of signals through the component circuits, thus making it possible to use high-frequency clock signals and realizing a high-speed operation and integration of circuits. However, with the structure disclosed in the foregoing publication U.S. Pat. No. 5,109,353, great importance is given only to the universal usefulness thereof, so that there is a very great likelihood for the FPGAs to be connected to one another, to connectors or to external devices via other internal wiring of the FPGAs. If the internal wiring of the FPGAs is used for these connections, the input-output buffer of the FPGAs having the internal wiring for the connections will cause a delay in signal transmission, which entails operation errors of the circuit provided. This gives rise to a need to additionally use a circuit for compensating for the delay in signal transmission although such a circuit need not be added to the actual circuit concerned. It is then difficult to evaluate the test circuit under the same conditions as the actual circuit.

Further although no problem arises if signal transmission necessitating a high speed is effected only between adjacent FPGAs, actual circuits are rarely so designed. If it is attempted to provide such an arrangement intentionally, the circuit concerned, which is complex, needs then be reconstructed through a procedure involving nearly the same difficulty as is encountered in constructing the whole circuit from the beginning. For this reason, some signals are transmitted through many FPGAs, so that it is difficult to conduct emulation without using an additional circuit for compensating for a delay of signals.

Additionally, VLSI chips or ASIC devices, which comprise completed specified circuits in combination, are likely to have wiring for bidirectional signal transmission between circuits. If other internal wiring of FPGA is used for the connection, there arises a need for a signal for a change-over between the input and output of input-output buffer of the FPGA, consequently necessitating connection of signal lines and also a complex control circuit.

The conventional pseudo-LSI device 3j shown in FIG. 16 has another problem in that when separated from the operation unit 2j, the device fails to function as such because the circuit data written onto the FPGA 12' disappears.

Accordingly, the pseudo-LSI device 3j is usable only as connected to the operation unit 2j and can not be separated from the unit 2j for use in confirming the operation of the device 3j and testing and debugging the target device.

Therefore, when the pseudo-LSI device 3j as completely checked for operation is to be used for testing in the next other section, not only the device 3j but also the operation unit 2j must be moved at the same time, and the circuit data thereafter needs to be downloaded from the operation unit 2j onto the device 3j again.

Moreover, in the case where tests and the like in different stages of developing LSI devices are to be carried out concurrently in different sections, emulation systems 1j, not less than the number of these sections in number, are necessary to result in an enormous equipment cost.

SUMMARY OF THE INVENTION

The present invention provides a pseudo-LSI device for emulating a signal electronic circuit using a plurality of programmable logic elements mounted on a common circuit board, which comprises a pseudo-operation unit comprising a plurality of programmable gate arrays constituting a pseudo-LSI when having circuit data written thereto, a nonvolatile memory unit for storing the circuit data to be downloaded from outside, a transfer unit for transferring the circuit data stored in the nonvolatile memory unit to the pseudo-operation unit, and a power supply unit, the four units being provided in the form of an assembly.

According to a preferred embodiment of the invention, the plurality of programmable gate arrays of the pseudo-operation unit are divided into groups, and specified terminals of the programmable gate arrays are divided into groups, the pseudo-operation unit having a wiring directly interconnecting the programmable gate arrays in the one gate array group one to one via one of the terminal groups and a wiring serving as a common bus and interconnecting the programmable gate arrays in the one gate array group via another one of the terminal groups, with respect to the inside of one of the programmable gate array groups.

Preferably, the pseudo-operation unit has a wiring serving as a common bus and interconnecting the programmable gate arrays in the one gate array group and in another optional one of the gate array groups via one of the terminal groups.

Preferably, the pseudo-operation unit has a wiring serving as a common bus and directly interconnecting all the programmable gate arrays in the one gate array group and in the other gate array groups via one of the terminal groups.

Preferably, the pseudo-LSI device may be so constructed that the transfer unit transfers the circuit data stored in the nonvolatile memory unit to the pseudo-operation unit when the power supply unit is switched on.

Preferably, the pseudo-LSI device may be connected with an operation device for downloading circuit data, thereby forming a debugging system.

With the debugging system, the operation device may be adapted to output a command for transferring the circuit data from the nonvolatile memory unit to the pseudo-operation unit after downloading the circuit data to the nonvolatile memory unit.

According to another preferred embodiment of the invention, the pseudo-operation unit has a wiring exchange LSI for permitting programming of the wiring between optional programmable gate arrays therein, the wiring exchange LSI being composed of a plurality of input terminals, a plurality of output terminals, a group of gates for selecting one of connection channels between the input terminals and the output terminals, and control input terminals for receiving control signals for driving the gate group and controlling the connection relation between the input terminals and the output terminals so as to straightforwardly determine the connection between one of the input terminals and one of the output terminals according to the control signals input. Usually, an EEPROM is used for the nonvolatile memory unit.

BRIEF DESCRIPTION OF THE DRAWINGS

FIGS. 10(a), 10(b), and 10(c) are diagrams showing the numbers of wires between FPGAs and between the FPGAs and connectors in the embodiment of FIG. 9;

DESCRIPTION OF THE PREFERRED EMBODIMENTS

Figure 1:
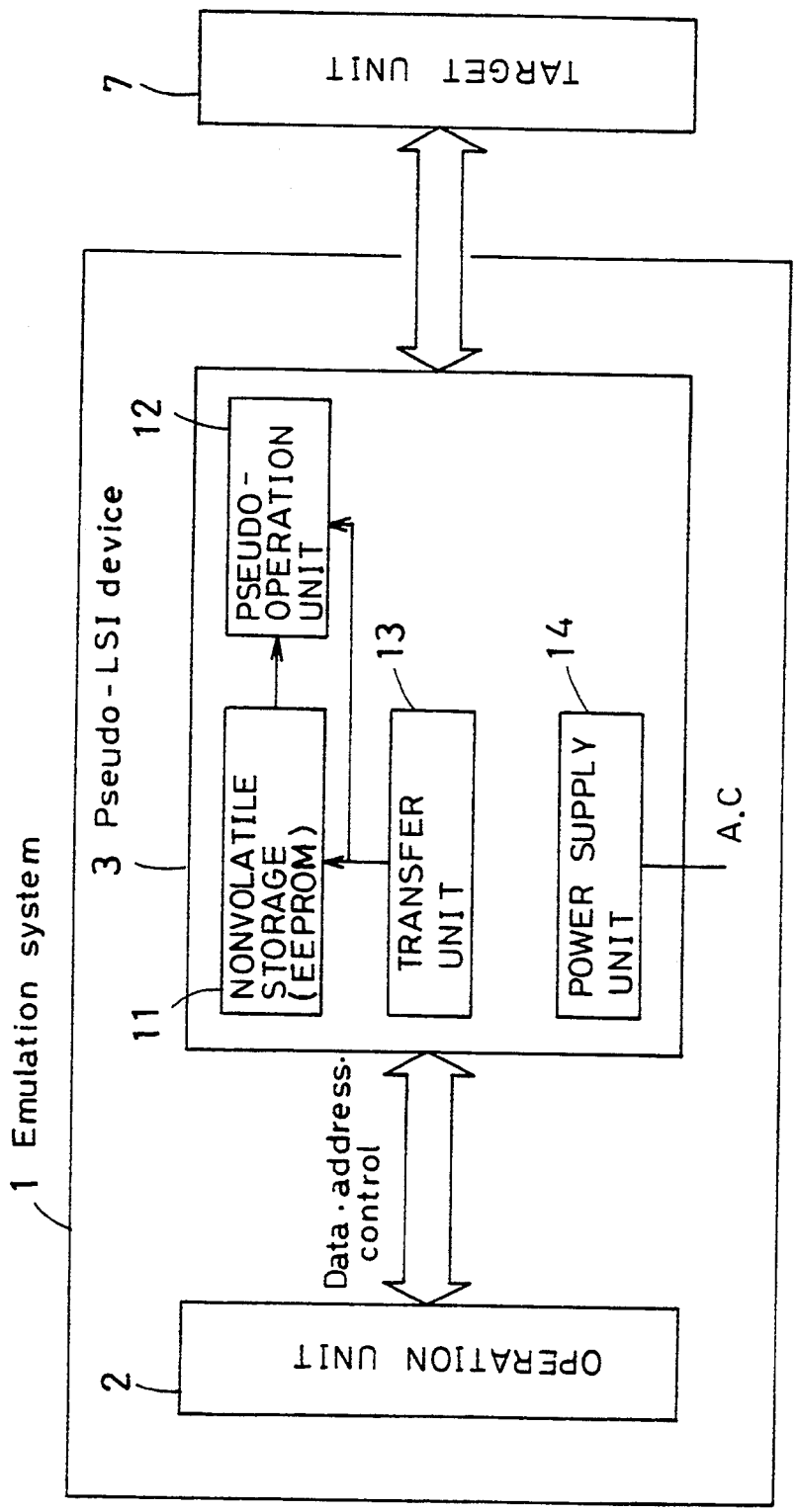
FIG. 1 is a block diagram of an emulation system embodying the invention.

FIG. 1 is a block diagram showing the construction of an emulation system 1 of the present invention. The emulation system 1 comprises a pseudo-LSI device 3, and an operation unit 2 for downloading circuit data to the pseudo-LSI device 3. The device and the unit are each in the form of an independent assembly so as to be physically separable when a cable interconnecting them is removed. The operation unit 2 has the same construction as the conventional operation unit 2j and serves to download circuit data onto the pseudo-LSI device 3. When required, a host computer is connected to the operation unit 2. A target device 7 is a device which functions when equipped with an LSI having the same construction as the pseudo-LSI device 3. The device 3 is connected to the target device 7 at the portion thereof where the LSI is to be mounted, for example, to test or debug the target device 7 itself.

The pseudo-LSI device 3 comprises a pseudo-operation unit 12 comprising a plurality of programmable gate arrays which constitute a pseudo-LSI when having circuit data written thereto, a nonvolatile memory unit 11 for storing the circuit data to be downloaded from outside, a transfer unit 13 for transferring the circuit data stored in the nonvolatile unit 11 to the pseudo-operation unit 12, and a power supply unit 14. These components are housed in a single case in the form of an assembly make the device easy to move (to carry around).

The nonvolatile memory unit 11 usually comprises an EEPROM (Electrically Erasable Programmable Read-Only Memory) for storing the circuit data to be downloaded from the operation unit 2. The EEPROM retains the stored circuit data even when the supply of power is discontinued, such that the stored data can be read out when power is restored.

The pseudo-operation unit 12 comprises a plurality of FPGAs and simulates the actual circuit to be emulated when having circuit data written thereto.

The transfer unit 13 serves to transfer the circuit data stored in the EEPROM to the FPGAs. The transfer unit 13 operates for the transfer when the power supply unit 14 is switched on or when commanded by the operation unit 2.

The power supply unit 14 serves to supply power to the nonvolatile memory unit 11, pseudo-operation unit 12 and transfer unit 13. Although an A.C. line provides power in the present embodiment, a primary cell, secondary cell or the like is usable alternatively or in combination therewith.

Figure 2:
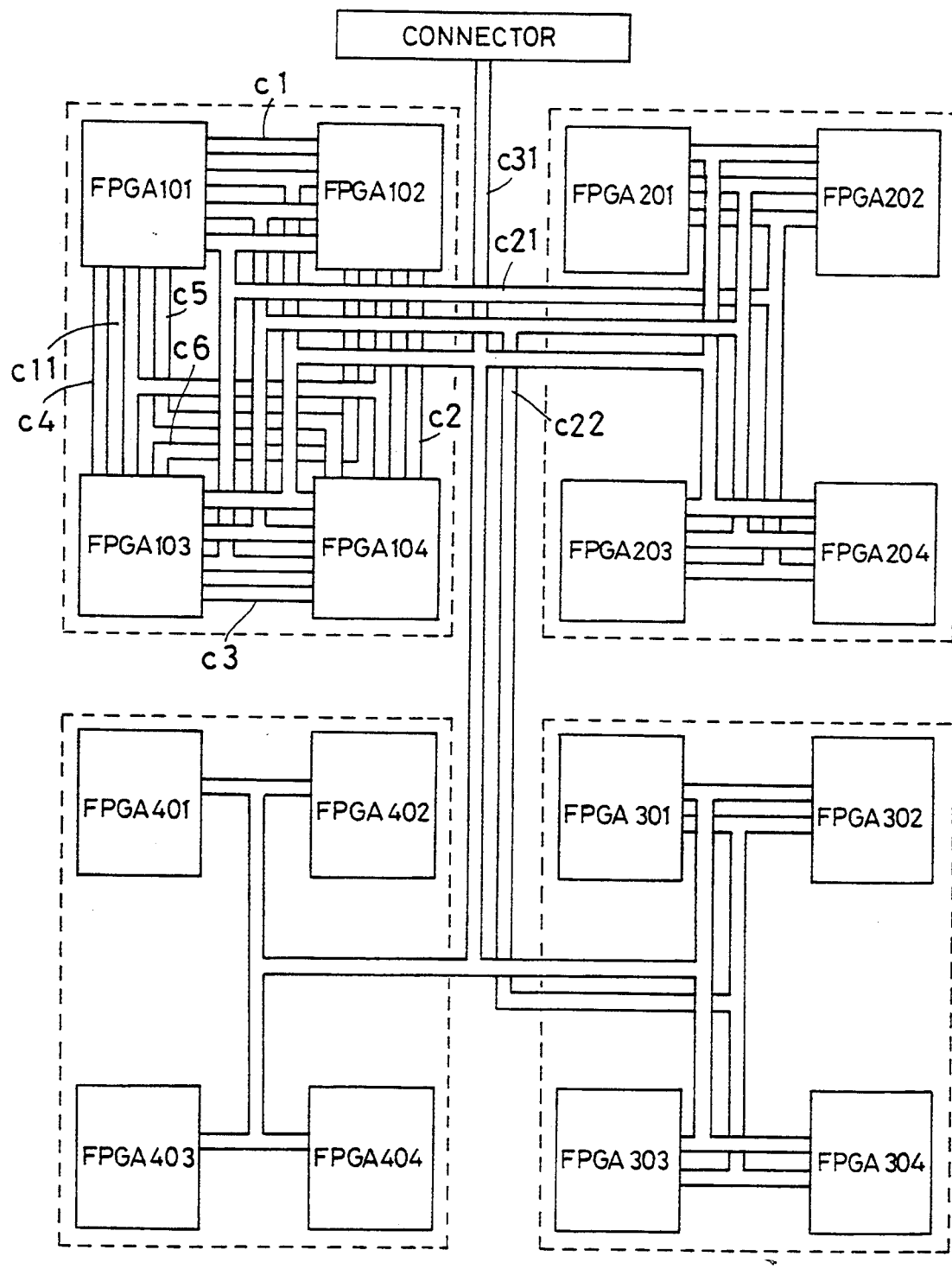
FIG. 2 is a diagram showing the principle in the internal wiring of a pseudo-operation unit of the invention.

FIG. 2 shows the principle in the internal wiring of the pseudo-operation unit 12 having the above construction.

With reference to the drawing, the pseudo-operation unit 12 comprises a plurality of FPGAs 101-404. The FPGAs are divided into groups 101-104, 201-204, 301-304 and 401-404, and specified terminals of the FPGAs are further divided into groups. The unit 12 has connection wires C1-C6 directly interconnecting the FPGAs in the group 101-104, a connection wire C11 serving as a common bus and directly interconnecting the FPGAs in the group 101-104, and connection wires C21 and C22 serving as common buses and directly connecting these FPGAs to the FPGAs of other groups 201-204 and 301-304. A connection wire C31 is further provided on the circuit board as a common bus directly interconnecting all the FPGAs in the group 101-104 and the other groups 201-204, 301-304 and 401-404.

Figure 3:
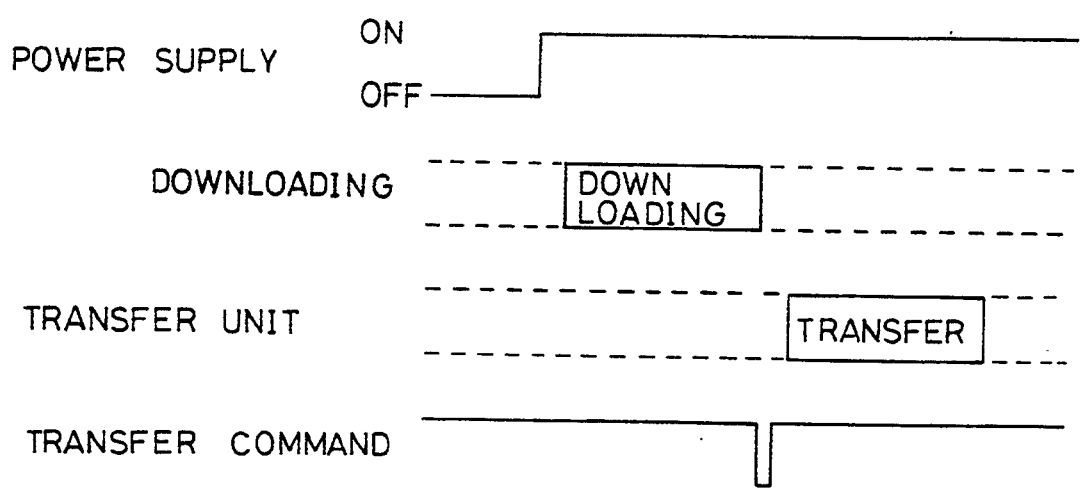
FIG. 3 is a timing chart showing the operation of a pseudo-LSI device embodying the invention and as connected to an operation unit.
Figure 4:
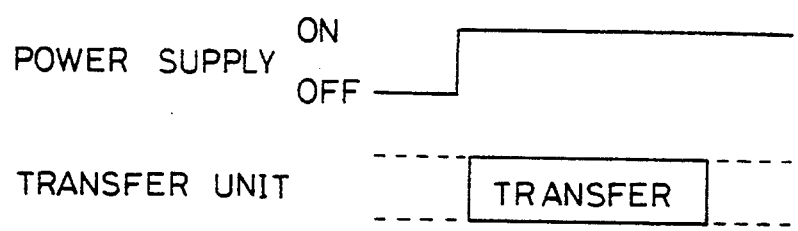
FIG. 4 is a timing chart showing the operation of the pseudo-LSI device of the invention as used singly.

Next, the operation of the pseudo-LSI device 3 will be described generally with reference to FIGS. 3 and 4, which are timing charts showing the operation of the pseudo-LSI device 3 as connected to the operation unit 2 and as used singly, respectively.

While the power supply unit 14 is on with the pseudo-LSI device 3 connected to the operation unit 2, circuit data is downloaded to the EEPROMs 11 under the control of the operation unit 2, and is further transferred from the EEPROMs 11 to the FPGAs 12 by the transfer unit 13 which is subsequently operated by a transfer command from the operation unit 2.

After the circuit data has been transferred to the FPGAs 12, the pseudo-LSI device 3 operates as a pseudo-LSI, for example, to test or debug the target device 7 connected to the device 3. If the result of the test or the like conducted reveals a need to modify the pseudo-LSI, modified circuit data is downloaded from the operation unit 2 to the EEPROM 11 and then transferred to the FPGAs 12.

The pseudo-LSI device 3 is provided with the power supply unit 14 and therefore operable as a pseudo-LSI even if the operation unit 2 is separated from the device 3. Accordingly, with the pseudo-LSI device 3 remaining in operation for testing, the operation unit 2 can be moved to other place and connected to another pseudo-LSI device 3 for emulation.

Now, a case will be described wherein the power supply unit 14 is temporarily switched off, for example, to move the pseudo-LSI device 3 to other place.

When the power supply unit 14 of the pseudo-LSI device 3 is switched off, the circuit data stored in the FPGAs 12 disappear. When the power supply is switched on again, however, the circuit data stored in the EEPROM 11 is transferred to the FPGAs 12 by the transfer unit 13 as shown in FIG. 3, whereby a pseudo-LSI is constructed for operation as such.

Accordingly, when to be moved, the pseudo-LSI device 3 need not be moved along with the operation unit 2 but can be moved with the power supply off. Moreover, the circuit data need not be downloaded from the operation unit 2 to the device 3 again after movement. The device is therefore movable and usable with extreme ease.

Further when a multiplicity of pseudo-LSI devices 3 are prepared, the devices 3 downloaded with the same circuit data can be installed in different sections for use in conducting various tests concurrently in these sections, whereby LSIs can be developed with an improved efficiency. Overall emulation systems 1 need not be fabricated but the pseudo-LSI devices 3 only are to be prepared. This results in a greatly reduced equipment cost.

Figure 5:
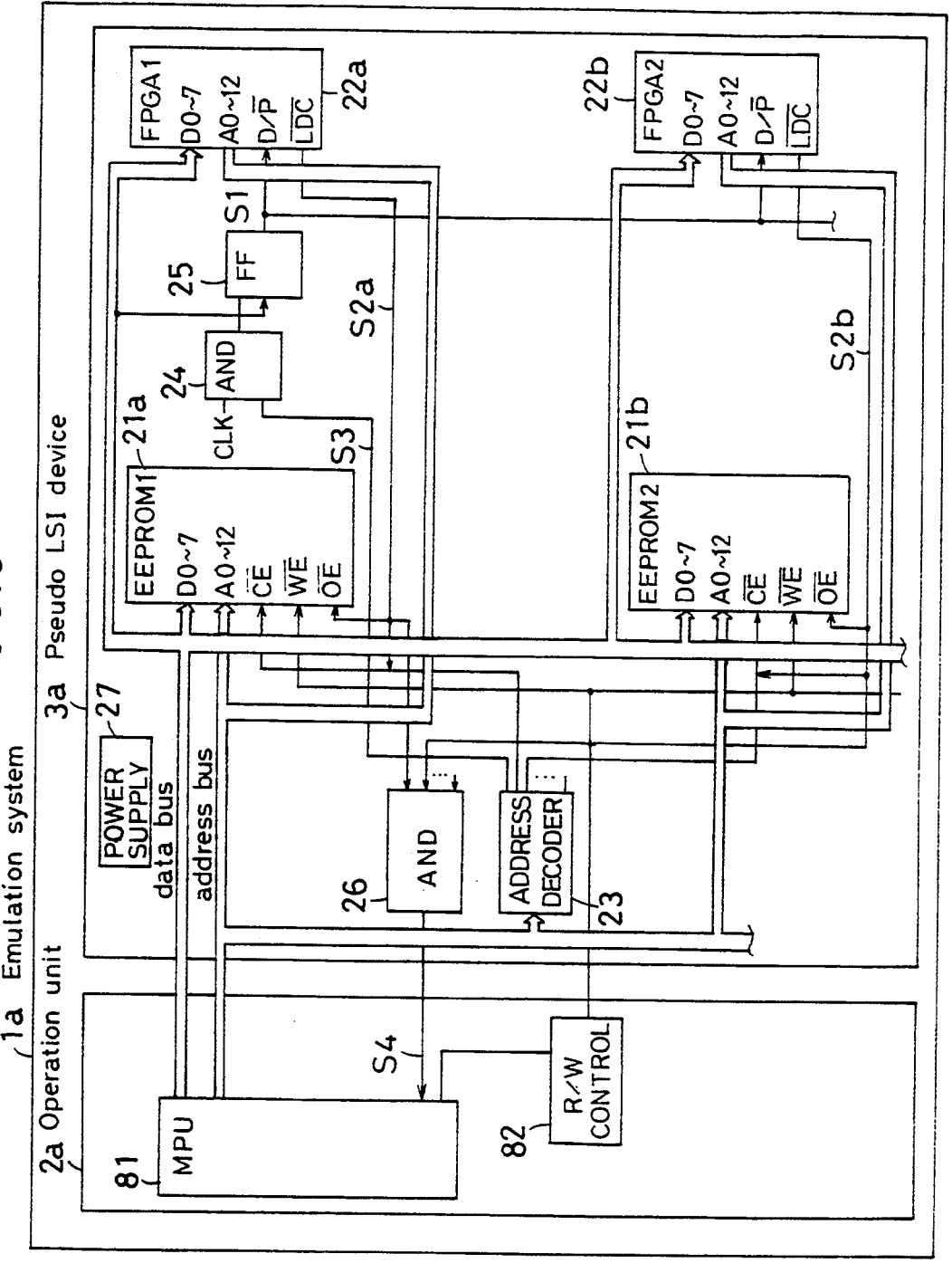
FIG. 5 is a block diagram of another pseudo-LSI device embodying the invention.
Figure 6:
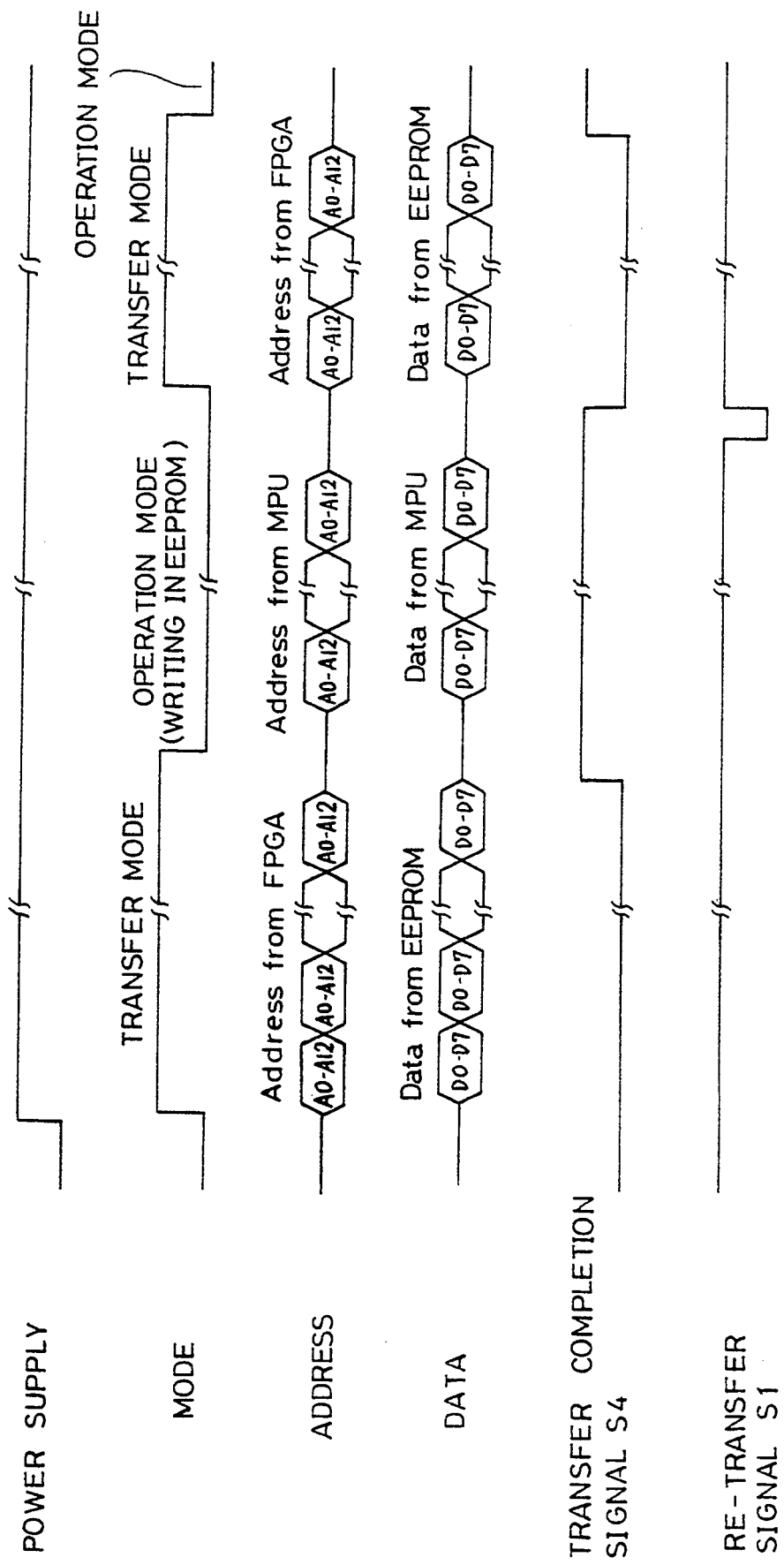
FIG. 6 is a timing chart showing the operation of the pseudo-LSI device of FIG. 5 as connected to an operation unit.
Figure 7:
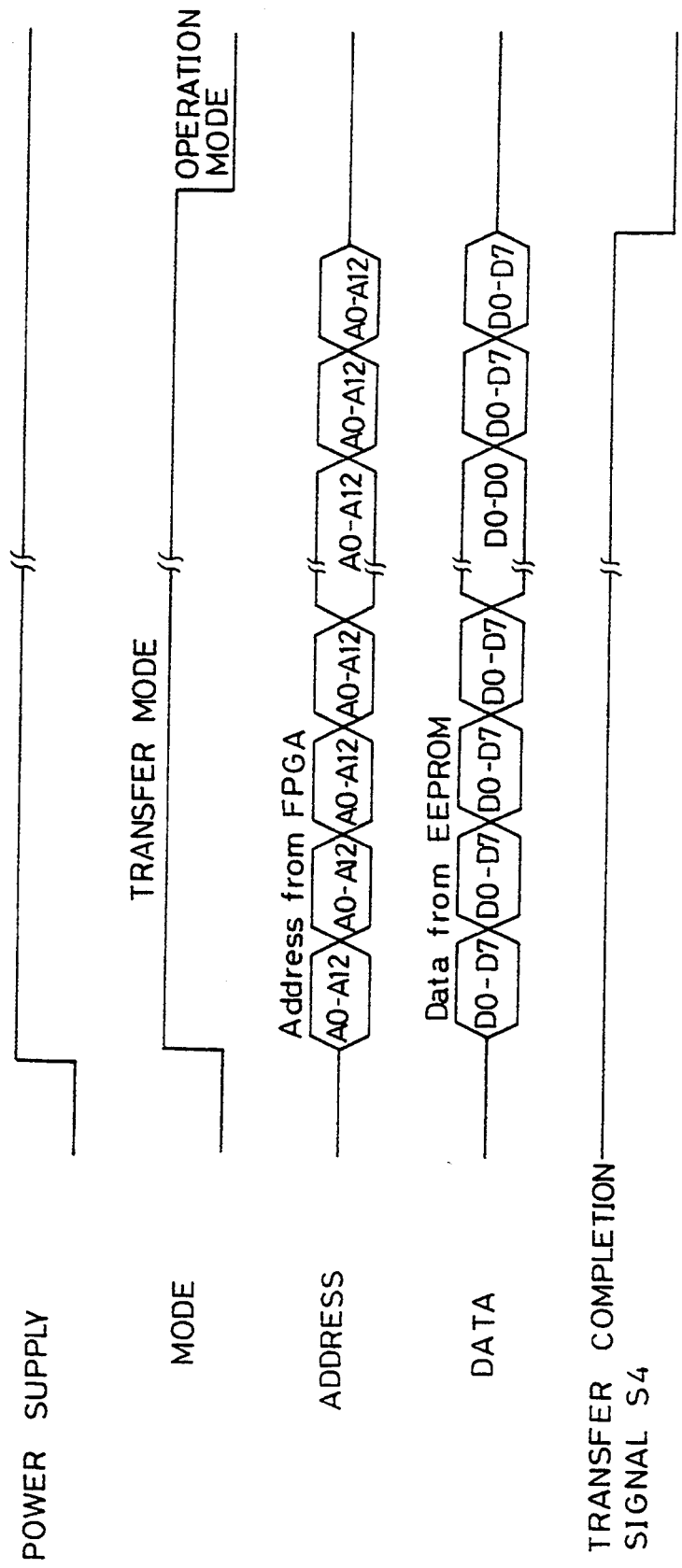
FIG. 7 is a timing chart showing the operation of the pseudo-LSI device as used singly.

FIG. 5 is a block diagram of another embodiment of the invention, i.e., a pseudo-LSI device 3a. FIG. 6 is a timing chart showing the operation of the pseudo-LSI device 3a as connected to an operation unit 2a, and FIG. 7 is a timing chart showing the operation of the device 3a as used singly.

The pseudo-LSI device 3a comprises a plurality of EEPROMs 21 (21a, 21b, . . . ), a plurality of FPGAs 22 (22a, 22b, . . .), address decoder 23, AND circuit 24, flip-flop 25, AND circuit 26 and power supply unit 27.

The FPGAs 22 have two modes, i.e., a transfer mode in which circuit data is written to the arrays, and an operation mode in which the arrays operate as a pseudo-LSI based on the circuit data written.

Each FPGA 22 is automatically brought into the transfer mode immediately after the power supply is switched on. The array is brought into the transfer mode also immediately after a negative pulse re-transfer signal S1 is fed to a D/P terminal (D when "H").

In the transfer mode, the FPGA 22 itself specifies addresses one after another, and at the same time, accepts circuit data from a data bus and stores the data at the specified addresses. At this time, each address specified is output to an address bus by the array 22, so that the EEPROM 21 is address-specified according to the address for items of circuit data to be read out therefrom one after another. In the transfer mode, therefore, the circuit data stored in the EEPROM 21 is automatically transferred to the FPGA 22.

Upon completion of the transfer in the transfer mode, an LDC terminal (low active) becomes "H", delivering a transfer termination signal S2 (S2a, S2b, . . .) and automatically changing the mode to the operation mode.

When circuit data is to be downloaded to the EEPROMs 21, the EEPROMs 21a, 21b, . . . are selected one after another by the address decoder 23. To produce the above-mentioned re-transfer signal S1, an MPU 81 outputs a specific address and data only for a short period of time. Upon detecting the specific address, the decoder 23 feeds an ON signal S3 of short duration to the AND circuit 24.

The AND circuit 24 and the flip-flop 25 prepare the re-transfer signal S1 from the ON signal S3 from the address decoder 23 and the specific data from the data bus.

When the transfer termination signals S2a, S2b, . . . output from the respective FPGAs 22a, 22b, . . . are all present, the AND circuit 26 feeds a transfer completion signal S4 of "H" to the MPU 81.

Next with reference to FIGS. 6 and 7, the operation of the emulation system 1a and the pseudo-LSI device 3a will be described.

Referring to FIG. 6, in the case where the pseudo-LSI device 3a is connected to the operation unit 2a, the FPGAs 22 are brought into the transfer mode by switching on the power supply unit 14, and data is automatically transferred from the EEPROMs 21a, 21b, . . . to the FPGAs 22a, 22b, . . . successively. At this time, it is likely that the EEPROMs 21 have no circuit data stored therein.

On completion of the transfer, a transfer completion signal S4 is fed to the MPU 81, and the FPGAs 22 are brought into the operation mode. In response to the signal, the MPU 81 downloads circuit data onto the EEPROMs 21.

On completion of downloading, the MPU 81 outputs a specific address and data, whereby a re-transfer signal S1 is input to the FPGAs 22. This signal S1 brings the FPGAs 22 into the transfer mode, permitting transfer of circuit data stored in the EEPROMs 21 to the FPGAs 22.

With the completion of the transfer, the FPGAs 22 are set in the operation mode to function as a pseudo-LSI based on the written circuit data. In the case where corrected circuit data, for example, is to be downloaded again, the MPU 81 is caused to output a re-transfer signal S1 again. During downloading, the pseudo-LSI device 3a is not used as a pseudo-LSI.

With reference to FIG. 7, when the pseudo-LSI device 3a is separate from the operation unit 2a, the FPGAs 22 are brought into the transfer mode by switching on the power supply unit 14, and circuit data stored in the EEPROMs 21 is automatically transferred to the FPGAs 22 as is the case with the former half of FIG. 5. On completion of the transfer, the FPGAs 22 are set in the operation mode to operate as a pseudo-LSI.

Like the pseudo-LSI device 3 previously described, the pseudo-LSI device 3a thus has outstanding advantages. It is extremely easy to move and convenient to use. A multiplicity of such devices, when prepared, are usable for concurrently conducting various tests to achieve an improved efficiency in developing LSIs and result in a greatly reduced equipment cost.

Although the pseudo-LSI device 3a has been described as having only two modes, i.e., transfer mode and operation mode, the device is able to set in various other modes by inputting different items of data to the mode setting pin of the FPGA 22.

For example, the FPGA 22 can be set in a write mode in which data is written to the FPGA 22, by specifying a particular address by way of the address bus. In the write mode, circuit data can be downloaded from the operation unit 2a directly to the FPGA 22.

For example, suppose there arises a need to alter the circuit data while the target device 7 is being debugged by the pseudo-LSI device 3a connected thereto. In this case, modified circuit data can be downloaded first to the EEPROM 21 and then to the FPGA 22, or is alternatively loadable directly to the FPGA 22 without loading the data to the EEPROM 21.

Incidentally, when the data is downloaded directly to the FPGA 22, the final circuit data is to be downloaded also to the EEPROM 21 later.

With the pseudo-LSI device 3a described, one EEPROM 21 is provided for one FPGA 22. Although this facilitates the transfer of circuit data, a suitable number of EEPROMs may alternatively be used, for example, according to the capacity and the number of gates instead of the one-to-one arrangement.

With the pseudo-LSI device 3a described, the circuit data is transferred sequentially from the EEPROMs 21 to the FPGAs 22, whereas a bus buffer may be inserted into the data bus and the address bus between the EE- PROMs 21 to thereby effect concurrent transfer of the circuit data.

Although the foregoing embodiments have been described with reference to a case wherein FPGAs and a transfer unit are assembled into a device, a device comprising programmable arrays may be provided separately from the transfer unit.

Although EEPROMs are used for the nonvolatile memory unit, alternatively usable are various erasable memory devices or combinations of such devices and other devices, such as SRAMs backed up with a battery. Various other modifications or alterations can be made in the construction of the operation unit 2 or 2a and the pseudo-LSI device 3 or 3a, the number and kind of component devices, circuit construction, control method, etc.

Next, embodiments of pseudo-operation unit 12 of the invention will be described.

Figure 8:
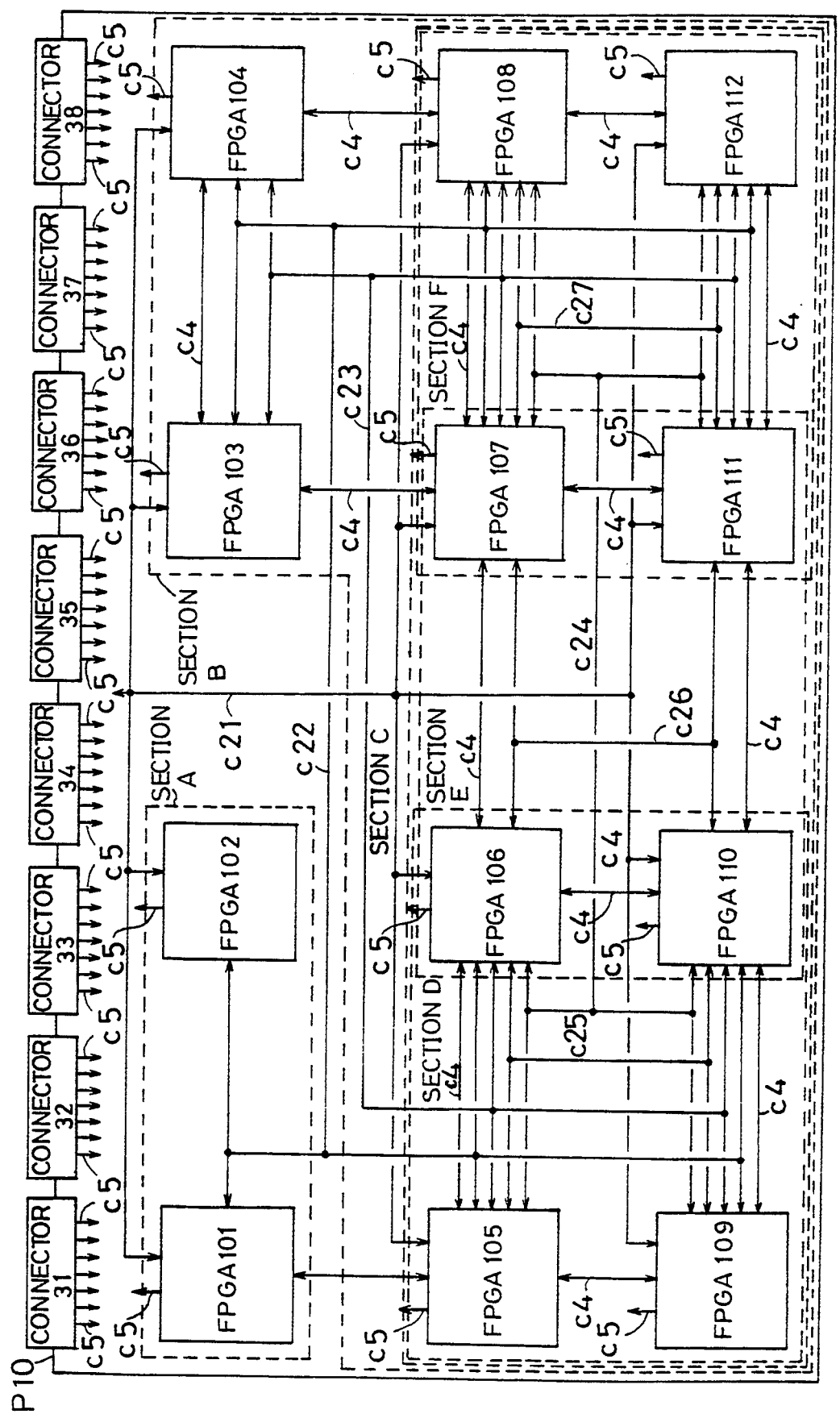
FIG. 8 is a diagram showing an embodiment of pseudo-operation unit of the invention.

FIG. 8 is a diagram showing a first embodiment of pseudo-operation unit 12 of the pseudo-LSI device according to the invention. The entire unit is mounted on a printed circuit board P10 serving as a common circuit board.

The pseudo-operation unit 12 comprises 12 FPGAs indicated at 101 to 112, connectors indicated at 31 to 38, bus connection wires C21 to C27 directly connecting the FPGAs 101 to 112 and the connectors 31 to 38, FPGA connection wires C4 for interconnecting the FPGAs adjacent to each other, and connector connection wires C5 for connecting the FPGAs 101–112 to the connectors 31 to 38.

The bus connection wire C21 is connected to all the FPGAs 101 to 112 of the pseudo-operation unit 12, includes groups of several lines connected to the respective connectors 31 to 38, is used primarily as a bus linked with an external device or measuring instrument connected to the unit 12 and serves for clock signals to be fed to the FPGAs 101 to 112. The bus connection wire C22 is connected to all the FPGAs 101 to 112 of the pseudo-operation unit 12, serves as a bus wire on the unit 12 and is used for signal transmission between FPGAs which are not interconnected directly by the wire C4.

The bus connection wire C23 is connected to all the FPGAs 103 to 112 arranged in a region of the unit 12 represented by section B, and is used for signal transmission for the FPGAs 103 to 112 in section B like the bus connection wire C22. Similarly, the remaining bus connection wires C24 to C27 are connected to the FPGAs in section C, to those in section D, to those in section E and to those in section F, respectively, and used for signal transmission.

Besides these bus connection wires C21 to C27, the pseudo-operation unit 12 of the pseudo-LSI device embodying the invention has lattice connection wires C4 as between the FPGAs 103 and 104 and between the FPGAs 103 and 107. The terminals remaining on the FPGAs 101 to 112 after the wiring described are assigned to the connectors 31 to 38. Each of the bus connection wires C21 to C27 preferably comprises about 10 to about 40 leads in the case where the unit 12 has 7 bus connection wires and 12 FPGAs with about 150 terminals.

When the pseudo-operation unit 12 thus constructed is to be used, one of the sections is selected for programming in conformity with the circuit to be constructed, and the connectors connected to the FPGAs in the selected section are used for connection to various external measuring devices or processing devices to test and evaluate the circuit.

For example, in the case where an interface circuit having a large number of signal lines for an external device and a specific processing circuit are to be combined into a single LSI device, the interface circuit is programmed in the FPGAs 101 and 102 arranged in section A, with the processing circuit programmed in the other FPGAs 103 to 112. At this time, all the FPGAs are connected together by the bus connection wires C21, C22, so that signals can be transmitted directly between any FPGAs. This obviates the need to provide an additional circuit for compensating for the delay that would otherwise occur.

Further when a multiplicity of specific circuits are to be combined into an ASIC device, these circuits are programmed in the respective FPGAs 101 to 112, and a measuring monitor signal is sent out to the connector connection wires C5 extending from the FPGAs 101–112 to the connectors to connect a measuring device to the connectors. Since direct connection can be ensured also in this case as stated above, there is no need to additionally use a circuit for compensating for a delay.

However, when the signal lines are fixed as in the present invention, it is likely that the number of signal lines will be insufficient. Accordingly, in the case where the above circuits are to be programmed in the pseudo-operation unit 12, circuits with many signal lines are concentrated, for example, on section D. This assures efficient use of the wiring.

Further when the bus connection wire C21 or C22 or like large-scale bus connection wire is used for signal transmission merely between two FPGAs, e.g., between FPGAs 101 and 112, one terminal of each of the other FPGAs 102 to 111 connected to the same bus connection wire becomes unusable, so that it is desired to divide the unit 12 into a plurality of sections and to provide a plurality of bus connection wires. When required, these bus connection wires may be used for one-to-one connection.

Next, a second embodiment of pseudo-operation unit 12 of the pseudo-LSI device according to the invention will be described with reference to FIG. 9.

The illustrated pseudo-operation unit 12 comprises 12 FPGAs and eight 80-pin connectors and is applicable to LSIs which are up to 466 in the number of I/O pins for connection to external devices and up to 6000 in the number of gates. XC3090 produced by Xilinx is useful as the FPGA. The circuit data to be written to these FPGAs are stored in two EEPROMs E1 and E2. The data is transferred from the EEPROMs to the FPGAs when the power supply is switched on.

The circuit data is stored in the EEPROM E1 for FPGAs 501, 502, 505, 506, 509 and 510 and in the EEPROM E2 for FPGAs 503, 509, 507, 508, 511 and 512.

Figure 9:
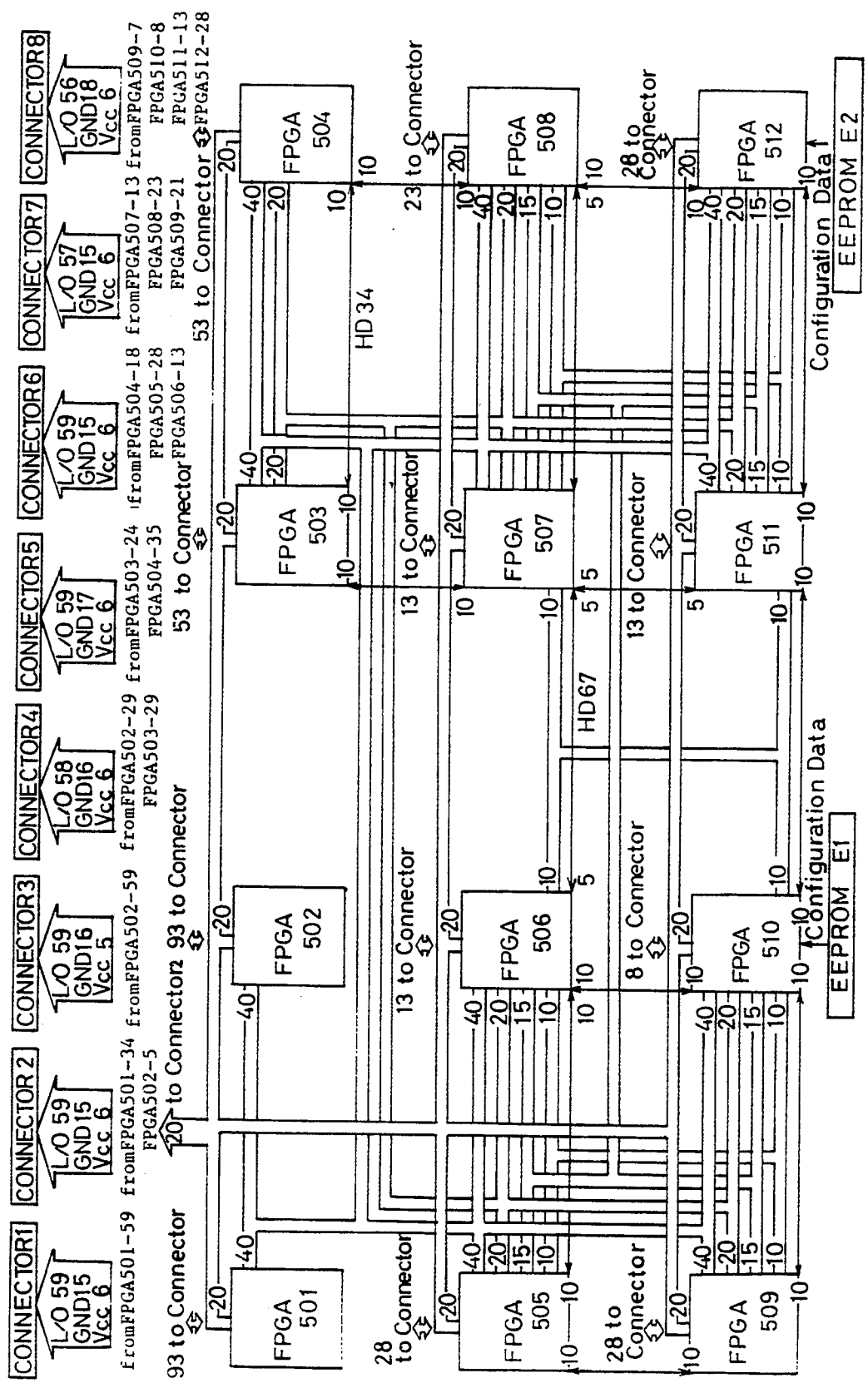
FIG. 9 is a diagram showing a wiring embodiment of pseudo-operation unit of the invention.
Figure 10B:
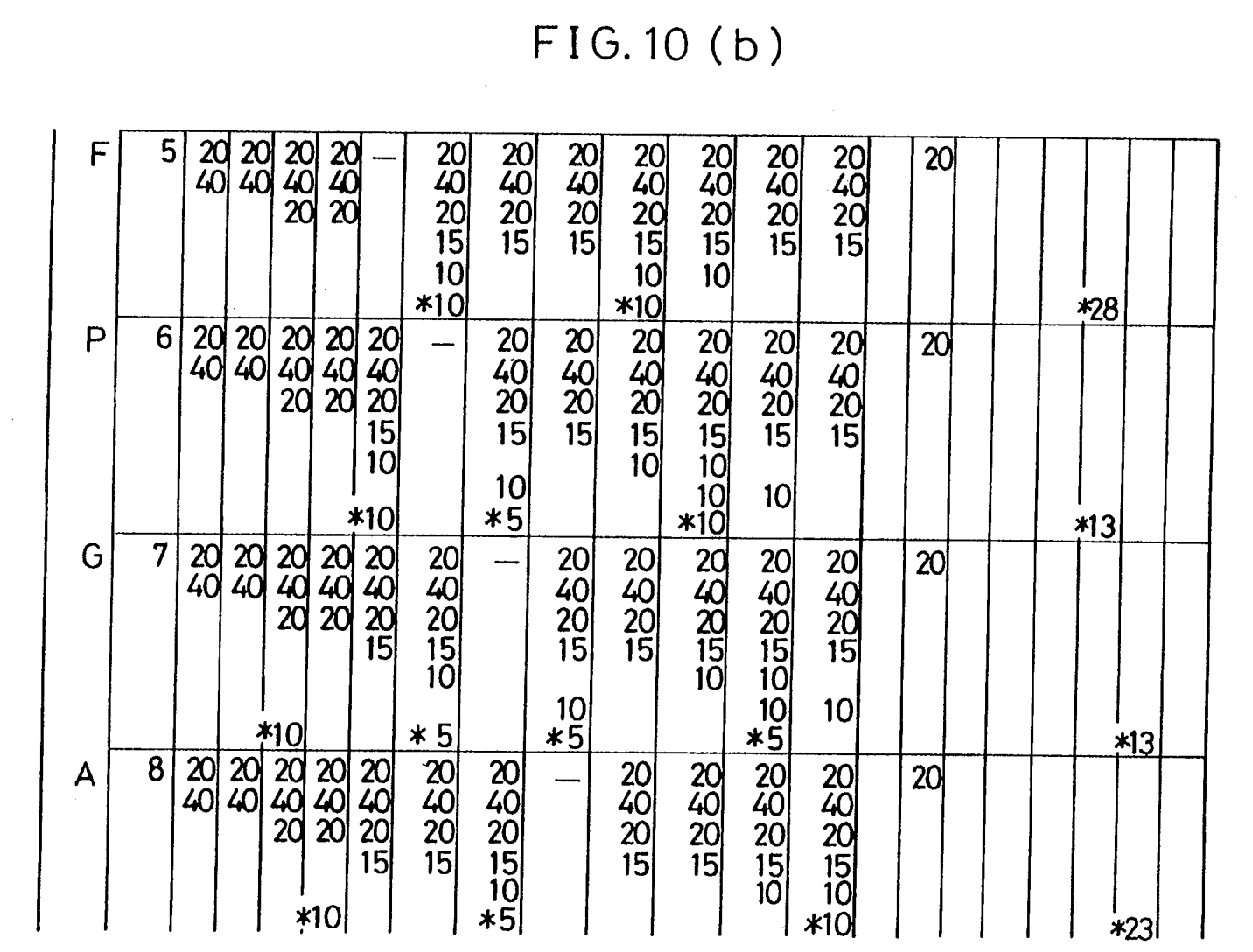
Figure 10C:
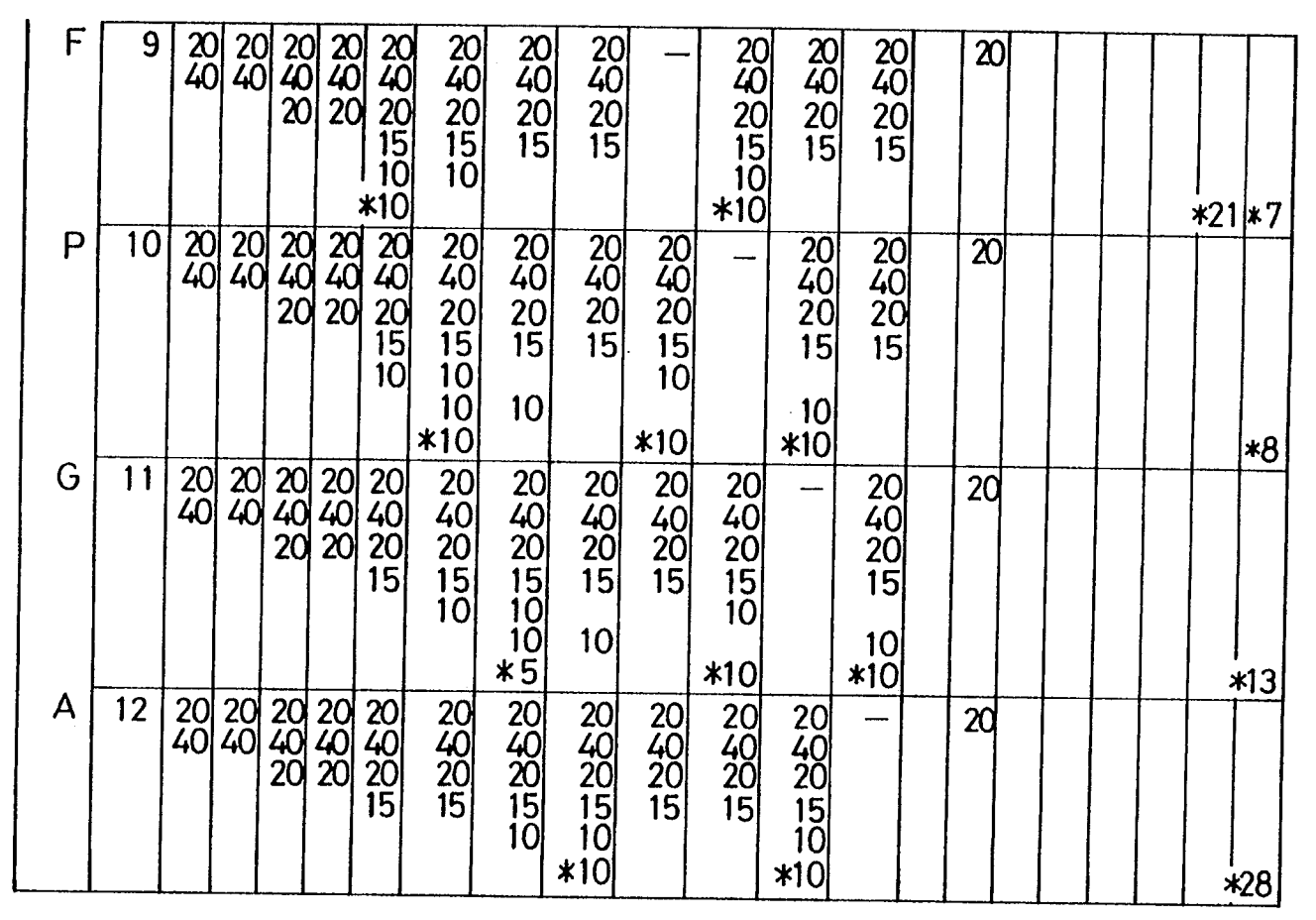

FIGS. 10, (a) and (b) show the number of wires in the pseudo-operation unit 12 shown in FIG. 9, i.e., the number of wires interconnecting the FPGAs and between the FPGAs and the connectors.

For example, the wires to be connected to FPGA 7 are as follows.

Directly connectable wires:
10 for FPGA 3
5 for FPGAs 6, 8, 10
13 for connector 7
Common bus wires:
10 for FPGAs 6, 10, 11

10 for FPGAs 8, 11, 12
15 for FPGAs 5, 6, 8, 9, 10, 11, 12
20 for FPGAs 3, 9, 5, 6, 8, 9, 11, 12
40 for FPGAs 1, 2, 3, 4, 5, 6, 8, 9, 10, 11, 12
20 for all FPGAs and connector 2

More specifically, the maximum numbers of wires connectable between FPGA 7 and the other FPGAs are as follows.

Wires connectable to FPGAs 1, 2: 60 max.
Wires connectable to FPGA 3: 90 max.
Wires connectable to FPGA 4: 80 max.
Wires connectable to FPGAs 5, 9: 95 max.
Wires connectable to FPGAs 6, 8: 110 max.
Wires connectable to FPGAs 10, 12: 105 max.
Wires connectable to FPGA 11: 120 max.

Figure 11:
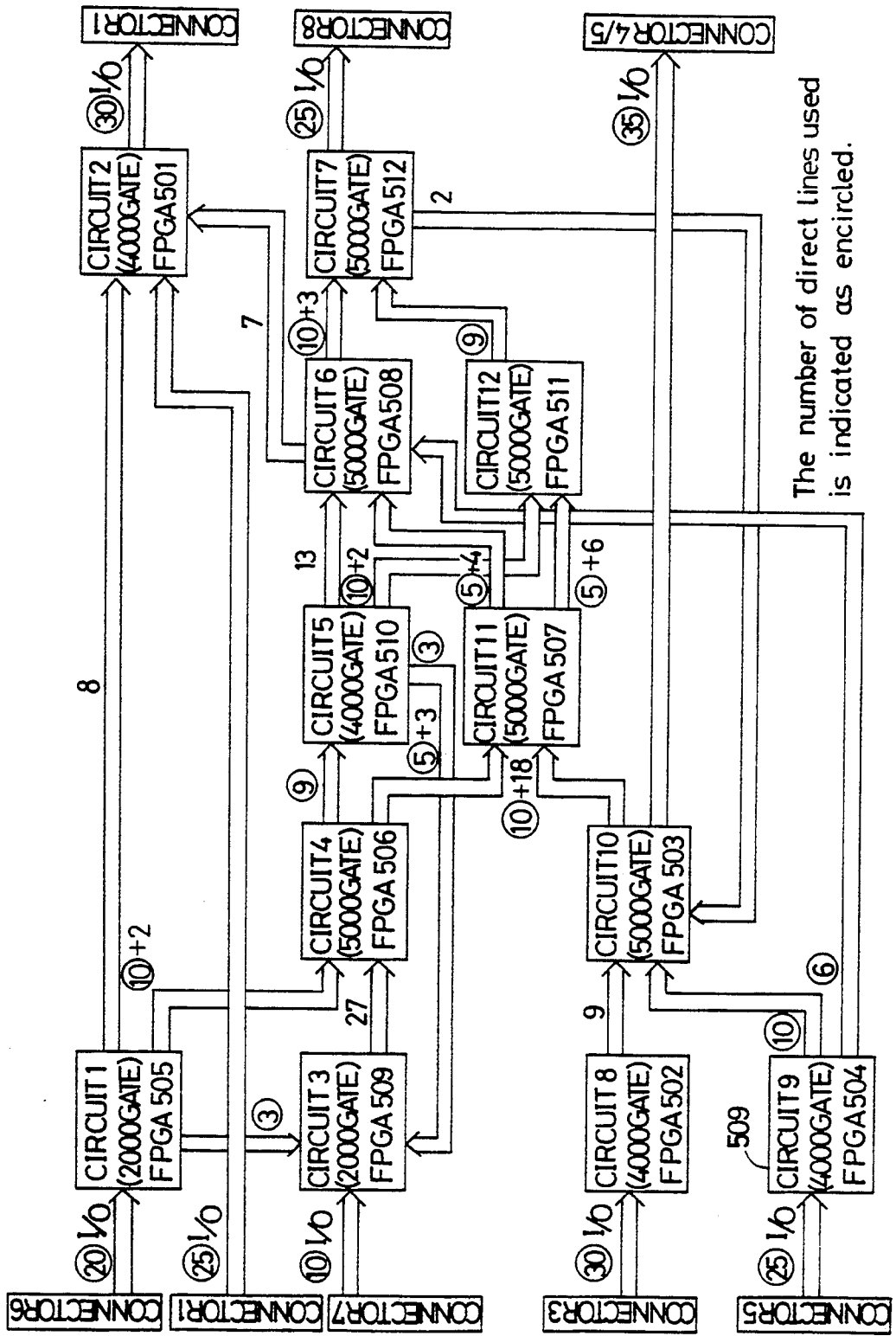
FIG. 11 is a diagram showing an embodiment of pseudo-operation unit of the invention as applied to Reed-Solomon/ECC.

FIG. 11 is a block diagram of an embodiment wherein the wiring system of pseudo-operation unit 12 of FIG. 9 is applied to a Reed-Solomon/ECC (Error Correcting Code) producing LSI. The illustrated embodiment has 50000 gates and 200 I/O pins.

This embodiment effectively utilizes universally useful direct connection lines and common bus lines to thereby provide a structure closely resembling an actual circuit and realize an emulated operation without using a circuit for compensating for a delay of signals.

A description will be given of an embodiment of pseudo-operation unit 12 of the pseudo-LSI device wherein a wiring exchange LSI is provided for rendering wiring between FPGAs therein programmable.

Figure 12:
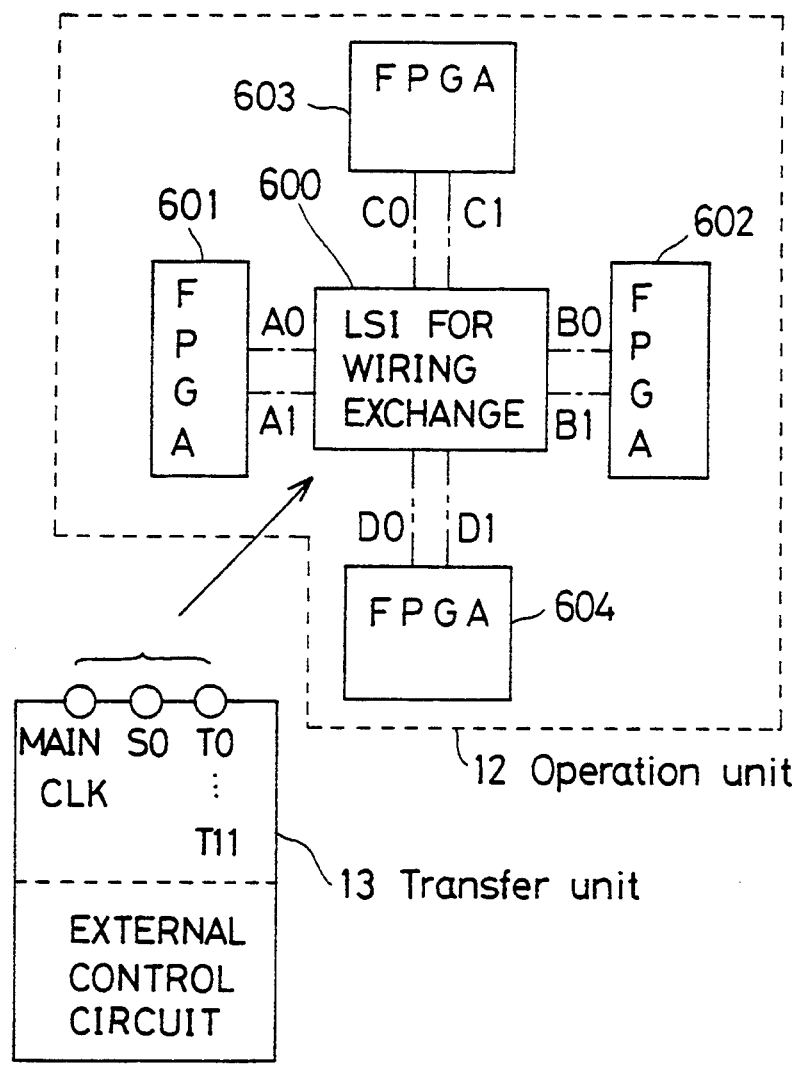
FIG. 12 is a block diagram showing an embodiment of pseudo-operation unit including a wiring exchange LSI.

FIG. 12 is a block diagram showing the embodiment wherein a wiring exchange LSI 600 is used for interconnecting FPGAs 601, 602, 603 and 604.

This embodiment has four 2-pin FPGAs which are interconnected by the wiring exchange LSI 600.

To program the internal wiring of the wiring exchange LSI 600, a transfer unit 13, for example, has an external control circuit for producing program control signals S0, T0, T1,... and external clock signals MAIN CLK.

A desired wiring channel inside the LSI 600 is selected by a suitable combination of these external clock signals and control signals to straightforwardly determine a particular terminal-to-terminal connection between the FPGAs.

Figure 13:
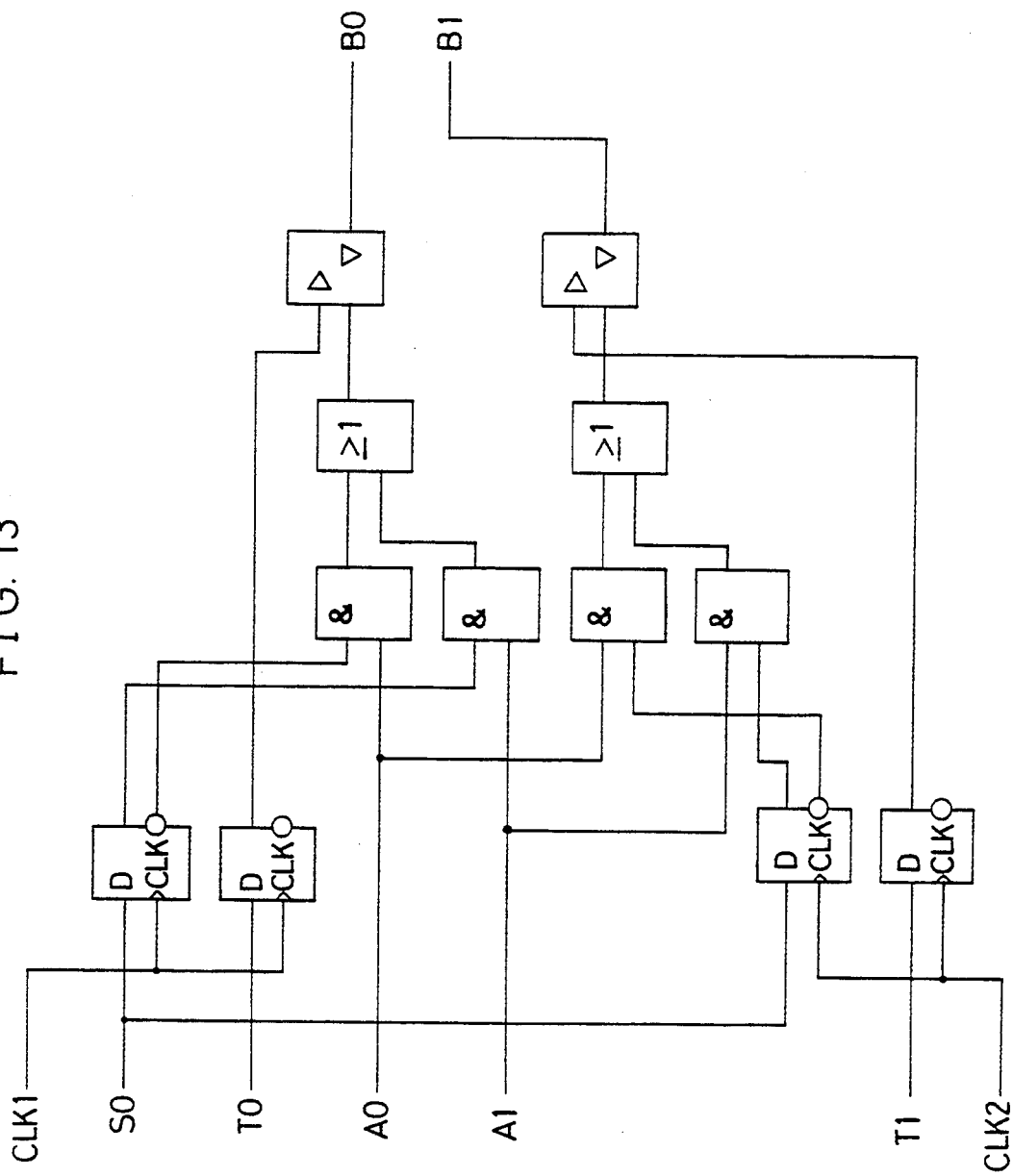
FIG. 13 is a diagram of a connection circuit between FPGA 601 and FPGA 602 in the embodiment of FIG. 12.
Figure 14:
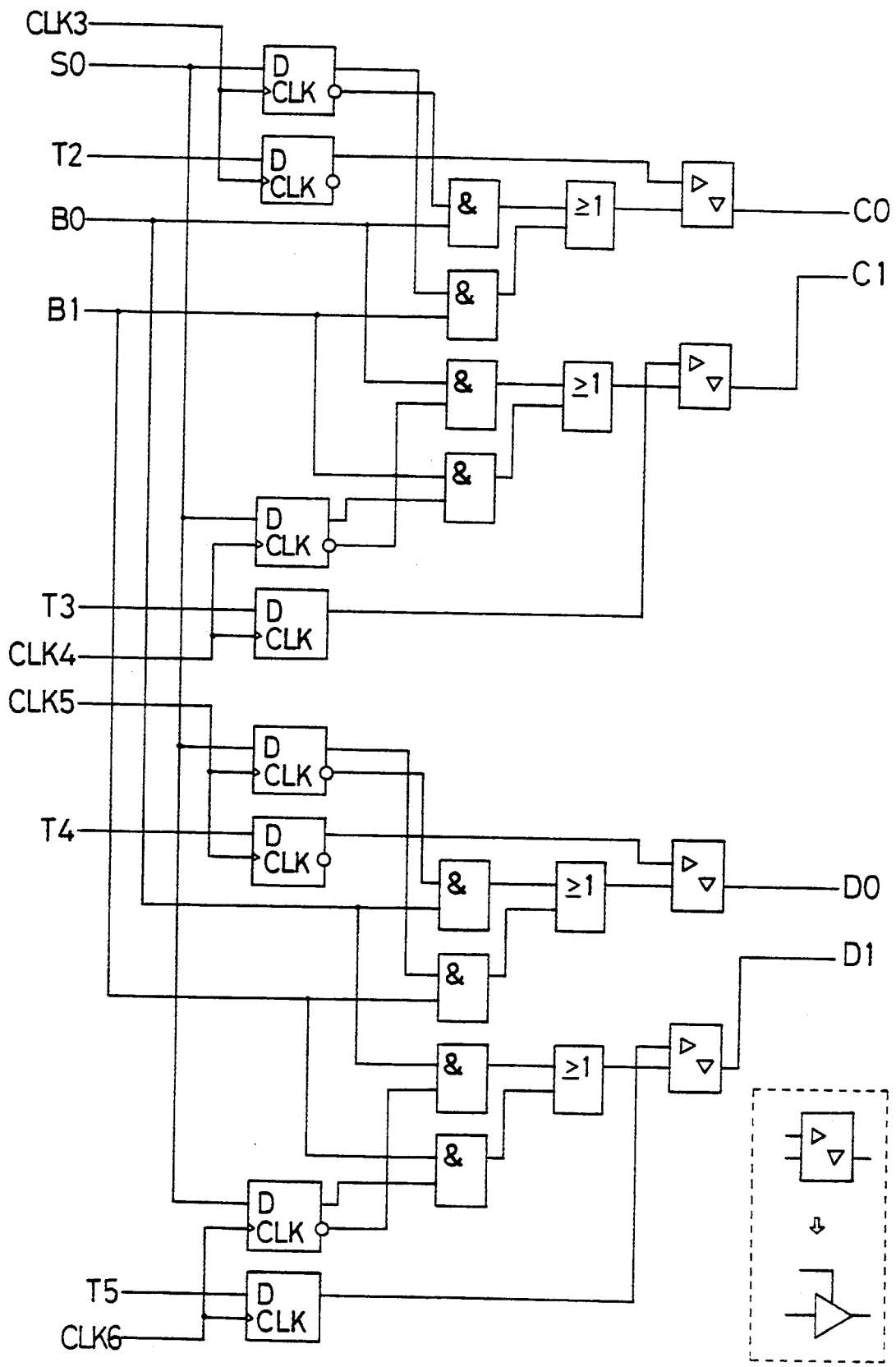
FIG. 14 is a diagram of connection circuits between FPGA 602 and FPGA 603 and between FPGA 602 and FPGA 604 in the embodiment of FIG. 12.

As examples of internal connection circuit diagrams of the wiring exchange LSI 600, FIG. 13 shows a diagram of connection circuit between the FPGAs 601 and 602, and FIG. 14 shows a diagram of connection circuits between the FPGAs 602 and 603 and between the FPGAs 602 and 604.

Figure 15:
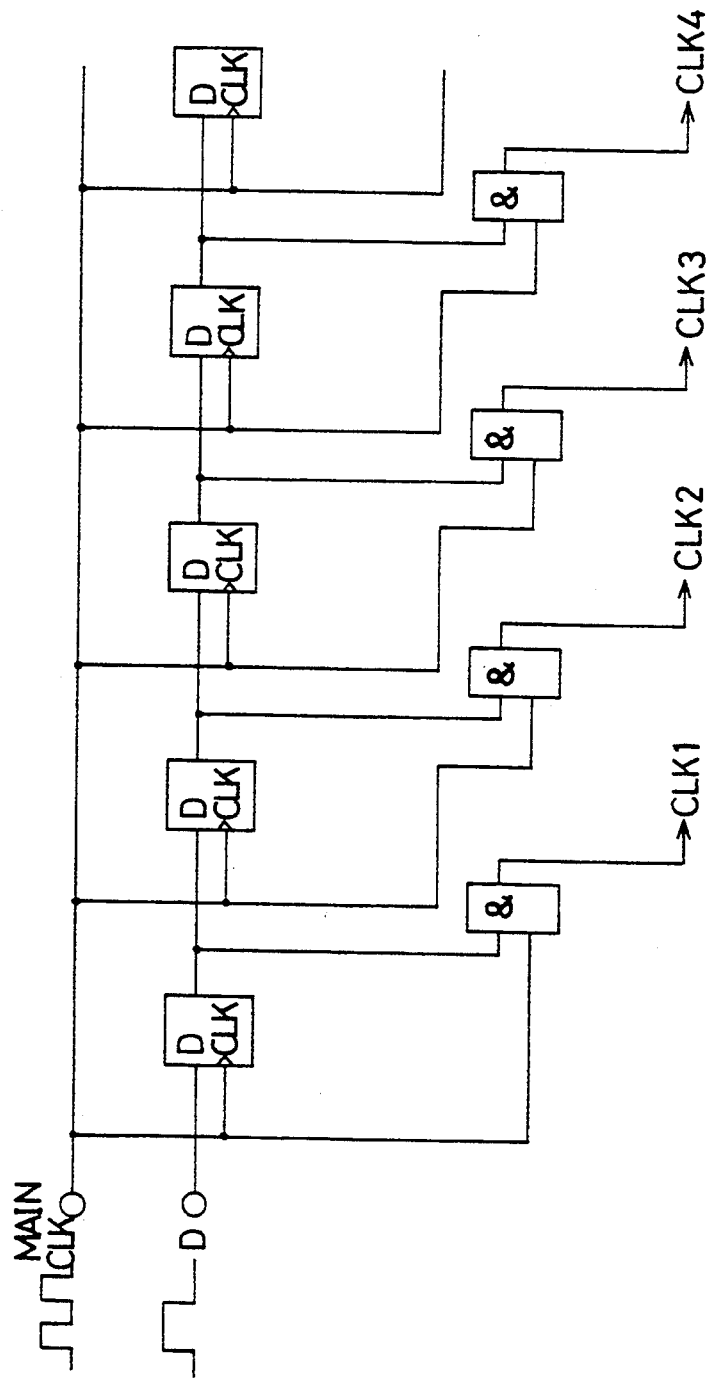
FIG. 15 is a diagram of a clock signal generator circuit in the embodiment of FIG. 12.
Figure 16:
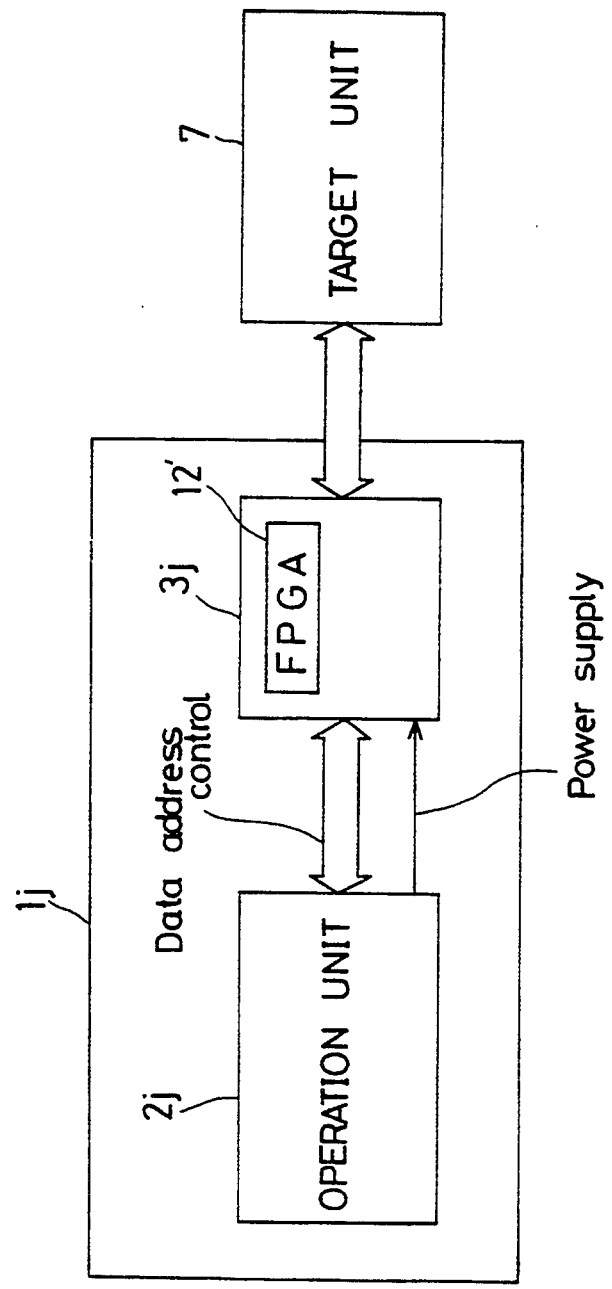
FIG. 16 is a block diagram of a conventional emulation system.
Figure 17:
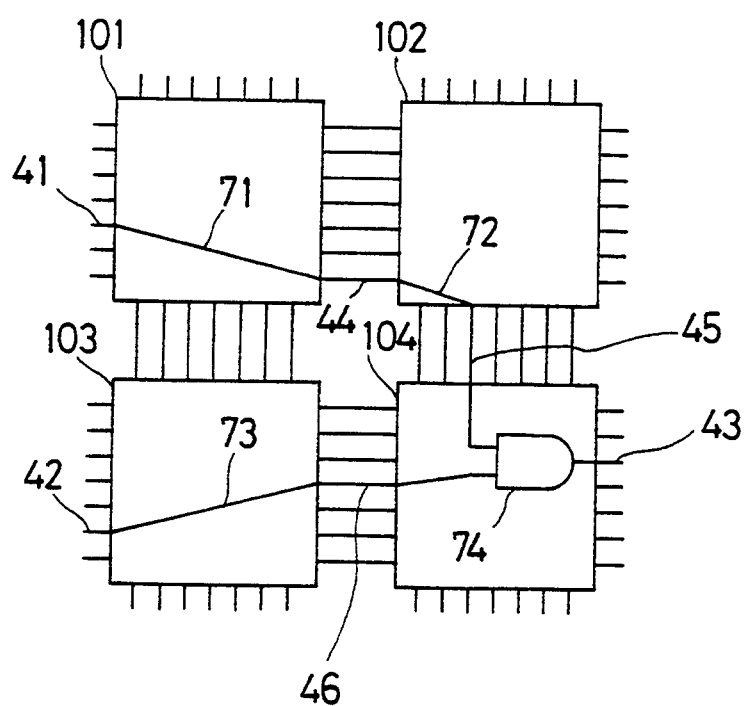
FIG. 17 is a diagram showing a conventional pseudo-LSI device.

Further FIG. 15 shows a circuit for generating clock signals which are out of phase.

With reference to FIG. 13, the terminal A0 or A1 of the FPGA 601 is connected to the terminal B0 or B1 of the FPGA 602 as desired by using the control signals S0, T0 and T1 and clock signals CLK1 and CLK2 in a selected combination.

Examples of connecting operations will be described below.

First, when the terminal A0 is connected to the terminal B0, the control signal S0 is set to "0" to specify the terminal A0. The control signal T0 is then made "1". Upon inputting the clock signal CLK1, the terminal A0 is connected to the terminal B0.

Similarly, the terminal A0 of the FPGA 601 is connected to the terminal B1 of the FPGA 602 by setting the control signal S0 to "0" to specify A0 and setting the control signal T1 to "1". The terminal A0 is connected to the terminal B1 when the clock signal CLK2 is thereafter applied to the circuit.

To connect the terminal A1 to the terminal B0, the control signal S0 is set to "1" to specify A1, and the control signal T0 to "1". These terminals are connected together when the clock signal CLK1 is thereafter given.

To connect the terminal A1 to the terminal B1, the control signal S0 is set to "1" to specify A1, and the control signal T1 is set to "1". The terminals are connected together when the clock signal CLK2 is then applied.

The terminal A0 of the FPGA 601 can be held out of connection merely by setting the control signal T0 to "0". The terminal A1 is held out of connection only by setting the control signal T1 to "0".

With the wiring exchange LSI provided centrally of the arrangement of FPGAs for wiring between the FPGAs, the pseudo-operation unit 12 can be made readily serviceable only by modifying the connection in the internal circuit of the wiring exchange LSI even if the number of pins on the FPGAs is altered.

According to the present invention, a nonvolatile memory unit is used for storing circuit data therein, so that the pseudo-LSI device, even if separated from the control unit, does not permit the circuit data to disappear. This makes it possible to provide pseudo-LSI devices adapted to constitute a pseudo-LSI and also to provide emulation systems.

Accordingly, for example when many pseudo-LSI devices are prepared, such devices of the same construction can be concurrently tested variously in different sections. This achieves an improved efficiency in developing LSIs and greatly reduces the equipment cost required.

Furthermore, the pseudo-LSI device has a nonvolatile memory unit which comprises EEPROMs or the like and which is provided separately from and externally of the pseudo-operation unit for actually emulating a particular circuit developed. This feature is useful in the case where different sections are concurrently developing firmware or software of evaluating hardware for inspection, using devices of the same construction as the pseudo-LSI device. If the circuit of the pseudo-LSI device is to be modified because a design error is found in the developed circuit in such a case, the emulation system main body need not be brought into each section, but an EEPROM having corrected circuit data stored therein needs only to be substituted.

Furthermore, the programmable gate arrays in the pseudo-operation unit 12 are interconnected by direct wires or bus connection wiring, so that even if there arises a need for signal transmission between any FPGAs, the signal can be transmitted via the wire or wiring with a greatly reduced delay. Moreover, the programmable gate arrays are divided into groups, which are made different in the wiring method or the number of wires. This permits selection of a particular group in conformity with the electronic circuit to be emulated, assuring the present device or system of nearly the same universal usefulness as in the prior art.

What is claimed is:

1. A pseudo-LSI device for emulating a single electronic circuit using a plurality of programmable logic elements mounted on a common circuit board, said pseudo-LSI device comprising:

a pseudo-operation unit including a plurality of programmable gate arrays constituting a pseudo-LSI when circuit data is transferred thereto;

a nonvolatile memory unit, connected to said pseudo-operation unit, for storing the circuit data downloaded from outside and used by said pseudo-operation unit;

a transfer unit, connected to said pseudo-operation unit and said nonvolatile memory unit for transferring the circuit data stored in the nonvolatile memory unit to the pseudo-operation unit; and a power supply unit, wherein said pseudo-operation unit, said nonvolatile memory unit, said transfer unit and said power supply unit being provided in a single case in a form of an assembly.

2. A pseudo-LSI device as defined in claim 1 wherein the plurality of programmable gate arrays of the pseudo-operation unit are divided into a plurality of gate array groups, and specified terminals of the programmable gate arrays are divided into a plurality of terminal groups, the pseudo-operation unit having a wiring directly interconnecting the programmable gate arrays within one gate array group via one of the terminal groups and a wiring serving as a common bus and said wiring interconnecting the programmable gate arrays in said one gate array group via another one of the terminal groups, with respect to an inside of one of the programmable gate array groups.

3. A pseudo-LSI device as defined in claim 2 wherein the pseudo-operation unit has a wiring serving as a common bus and said wiring interconnecting the programmable gate arrays in said one gate array group and in another optional one of the gate array groups via one of the terminal groups.

4. A pseudo-LSI device as defined in claim 2 wherein the pseudo-operation unit has a wiring serving as a common bus and directly interconnecting all the programmable gate arrays in said one gate array group and in the other gate array groups via one of the terminal groups.

5. A pseudo-LSI device as defined in claim 1 wherein the transfer unit transfers the circuit data stored in the nonvolatile memory unit to the pseudo-operation unit when the power supply unit is switched on.

6. A pseudo-LSI device as defined in claim 1 which is connected with an operation device for downloading circuit data, therein forming a debugging system.

7. A pseudo-LSI device as defined in claim 6 in which the operation device is adapted to output a command for transferring the circuit data from the nonvolatile memory unit to the pseudo-operation unit after downloading the circuit data to the nonvolatile memory unit.

8. A pseudo-LSI device as defined in claim 1, wherein the pseudo-operation unit has a wiring exchange LSI for permitting programming of wiring between optional programmable gate arrays therein, the wiring exchange LSI being composed of a plurality of input terminals, a plurality of output terminals, a group of gates for selecting one of connection channels between the plurality of input terminals and the plurality of output terminals, and control input terminals for receiving control signals for driving the group of gates and controlling connection relation between the plurality of input terminals and the plurality of output terminals so as to straightforwardly determine connection between one of the plurality of input terminals and one of the plurality of output terminals according to the control signal input.

* * * * *